United States Patent
Ho et al.

(10) Patent No.: US 9,101,034 B2
(45) Date of Patent: Aug. 4, 2015

(54) ORGANIC LIGHT EMITTING DEVICE AND LIGHT ADJUSTING METHOD THEREOF

(71) Applicant: GCSOL Tech Co., Ltd., Taichung County (TW)

(72) Inventors: Fang-Chuan Ho, Hsinchu (TW); Jui-Fen Pai, Nantou County (TW)

(73) Assignee: GCSOL Tech Co., Ltd., Taichung (TW)

( * ) Notice: Subject to any disclaimer, the term of this patent is extended or adjusted under 35 U.S.C. 154(b) by 372 days.

(21) Appl. No.: 13/726,598

(22) Filed: Dec. 25, 2012

(65) Prior Publication Data

US 2014/0103833 A1    Apr. 17, 2014

(30) Foreign Application Priority Data

Oct. 16, 2012 (TW) .............................. 101138087 A

(51) Int. Cl.
  *H05B 37/02* (2006.01)
  *H05B 33/08* (2006.01)
  *H05B 33/12* (2006.01)
  *C09K 11/77* (2006.01)

(52) U.S. Cl.
  CPC ........ *H05B 33/0896* (2013.01); *C09K 11/7792* (2013.01); *H05B 33/0863* (2013.01); *H05B 33/12* (2013.01)

(58) Field of Classification Search
  CPC . H05B 33/12; H05B 33/0863; H05B 33/0896
  USPC .......... 315/291, 294; 313/498, 501, 504, 506; 362/97.1, 231; 257/E25.02
  See application file for complete search history.

(56) References Cited

U.S. PATENT DOCUMENTS

| | | | |
|---|---|---|---|
| 6,727,660 B1 * | 4/2004 | Heller .......................... | 315/169.2 |
| 7,401,943 B2 * | 7/2008 | Okamitsu et al. ............. | 362/227 |
| 7,775,669 B2 * | 8/2010 | Liao et al. ........................ | 353/94 |
| 8,025,421 B2 * | 9/2011 | Ku ................... | 362/231 |
| 8,405,300 B2 * | 3/2013 | Van Bommel et al. ........ | 313/501 |
| 8,491,140 B2 * | 7/2013 | Van De Ven et al. ........... | 362/84 |
| 8,690,414 B2 * | 4/2014 | Tomotoshi et al. ........... | 362/616 |
| 8,833,955 B2 * | 9/2014 | Fang et al. .................... | 362/97.1 |
| 8,915,634 B2 * | 12/2014 | Hsu et al. ...................... | 362/606 |
| 2008/0007936 A1 | 1/2008 | Liu et al. | |

FOREIGN PATENT DOCUMENTS

| TW | I277229 B | 3/2007 |
|---|---|---|
| TW | M458673 U | 8/2013 |

* cited by examiner

*Primary Examiner* — Kenneth B Wells
(74) *Attorney, Agent, or Firm* — CKC & Partners Co., Ltd.

(57) ABSTRACT

An organic light emitting device includes, a first organic light emitting diode unit, a second light emitting diode unit, and an optical component. The first organic light emitting diode unit is connected with the second organic light emitting diode unit, and an internal angle is formed between the two organic light emitting diode units. The first organic light emitting diode unit, the second organic light emitting diode unit, and the optical component are connected together to form a triangle structure. A first light emitting region of the first organic light emitting diode unit and a second light emitting region of the second organic light emitting diode unit are overlapped on the optical component and forming a third light emitting region. A uniform light can be obtained by adjusting the first organic light emitting diode unit and the second organic light emitting diode unit respectively.

23 Claims, 11 Drawing Sheets

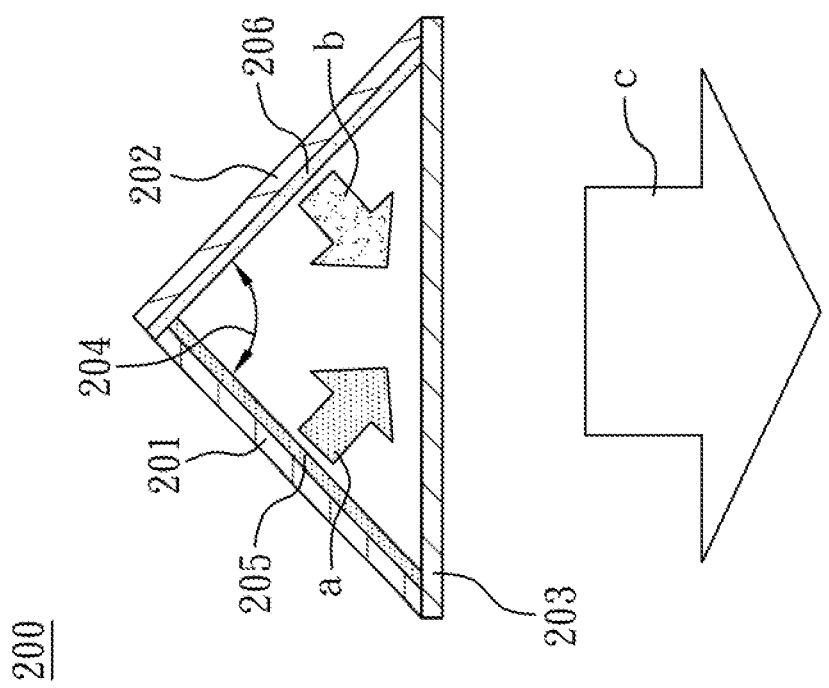

ORGANIC LIGHT EMITTING DEVICE AND LIGHT ADJUSTING METHOD THEREOF

RELATED APPLICATIONS

The application claims priority to Taiwan Application Serial Number 101138087, filed on Oct. 16, 2012, which is herein incorporated by reference.

BACKGROUND

1. Technical Field

The present invention relates to a light emitting device, especially to an organic light emitting device having a light source which is a mixture of the light of two individual organic light en thing diode panels.

2. Description of Related Art

A light emitting diode is a solid-lighting device that has been rapidly developed in recent years; and an organic light emitting diode (OLED) is an important branch of the light emitting diode. Early organic light emitting diode such as those disclosed on U.S. Pat. No. 3,172,862 and U.S. Pat. No. 4,356,429, have disadvantages on excesses thickness (>1 μm) and high operation voltage (>100 Volt), so that it is not suitable for commercial applications. An improvement structure of the organic light emitting diode has been demonstrated by Eastman Kodak Company in 1987. The improvement structure provided by Eastman Kodak Company is to place a small molecular organic light emitting material between two electrodes. And then, a polymer light emitting diode is disclosed by Cambridge University in 1900. Since then, aggressive researches have been employed on the developments of the organic light emitting devices Therefore, a great progress have been reached on the grasp of the material characteristic and the manufacturing technology of the organic light emitting diode, and thereby making the commercial applications of the organic light diode be possible.

Singlet excited states transition and triplet excited states transition are two important fundamental light emitting mechanisms of an organic light emitting diode. A transition from a singlet excited state to a ground state is known as fluorescence; and a transition from a triplet excited state to a ground state is known as phosphorescence. Different wavelength of an emitting light can be produced by the two transition mechanisms with selection of different light emitting materials. However, the light colors seen by human eye are not a single wavelength, but a mixture of multiple wavelengths, thus the adjustment of the light color by mixing different wavelengths is an important issue. U.S. Pat. No. 5,851,063 disclosed a method for producing white light by mixing the primary colors of the light (RGB system), which uses inorganic light emitting diode as light source. Compared to the inorganic light emitting diode, organic light emitting diode has advantages on self-lighting, high brightness, high contrast, short response time, compact size, flexibility, and simple structure. The sheet type of the emitting light of an organic light emitting diode makes it suitable for lighting and flat panel display.

U.S. patent 2008/0284317A1 disclosed a light adjusting method of an organic light emitting diode, in which a fluorescent blue emission layer, a phosphorescent red emission layer, and a phosphorescent green emission layer are combined into a single organic light emitting diode. However, it is difficult to drive each emission layer with only one current/voltage source due to the different material characteristics of each emission layer. An improved organic light emitting diode structure is disclosed in U.S. Pat. No. 7,935,963. Fluorescence layers and phosphorescence layers are divided into two individual regions by an electrode layer in one organic light emitting diode. Therefore, different current/voltage sources can be applied to the fluorescence layers and the phosphorescence layers independently, and the controllability can be enhanced. The improvement structure can solve the difficulty of applying a single power source on the different emission layers, however, the emission layers are still combined in a single organic light emitting diode structure, thus the light path will be blocked, thereby reducing the light emitting efficiency.

SUMMARY

According to one aspect of the present disclosure, an organic light emitting device is provided. The organic light emitting device includes a first organic light emitting diode unit, a second organic light emitting diode unit, and an optical component. The second organic light emitting diode unit is connected with the first light emitting diode unit, and the optical component connects the first organic light emitting diode unit and the second organic light emitting diode unit. A first incline angle is formed between the first organic light emitting diode unit and a virtual base plane, and a second incline angle is formed between the second organic light emitting diode unit and the virtual base plane. An internal angle is formed between the first organic light emitting diode unit and the second organic light emitting diode unit, and is faced toward the optical component. A first light emitting region of the first organic light emitting diode unit and a second light emitting region of the second organic light emitting diode unit are overlapped on the optical component, and a sum of the first incline angle, the second incline angle, and the internal angle is 180 degrees.

According to another aspect of the present disclosure, a light adjusting method utilizes the organic light emitting device is provided. The light adjusting method includes the steps as follows. The first light emitting region is emitted by the first organic light emitting diode unit. The second light emitting region is emitted by the second organic light emitting diode unit. Connect the first organic light emitting diode unit and the second organic light emitting diode unit, and the internal angle being less than 180 degrees is formed between the two units. Connect the first organic light emitting diode unit and the second organic light emitting diode unit by the optical component, and the internal angle is faced toward the optical component. The first light emitting region and the second light emitting region is overlapped on the optical component, and a third light emitting region is formed through the optical component.

BRIEF DESCRIPTION OF THE DRAWINGS

The disclosure can be more fully understood by reading the following detailed description of the embodiment, with reference made to the accompanying drawings as follows:

FIG. 3 is a side view of an organic light emitting device according to another embodiment of the present disclosure;

DETAILED DESCRIPTION

Figure 1:
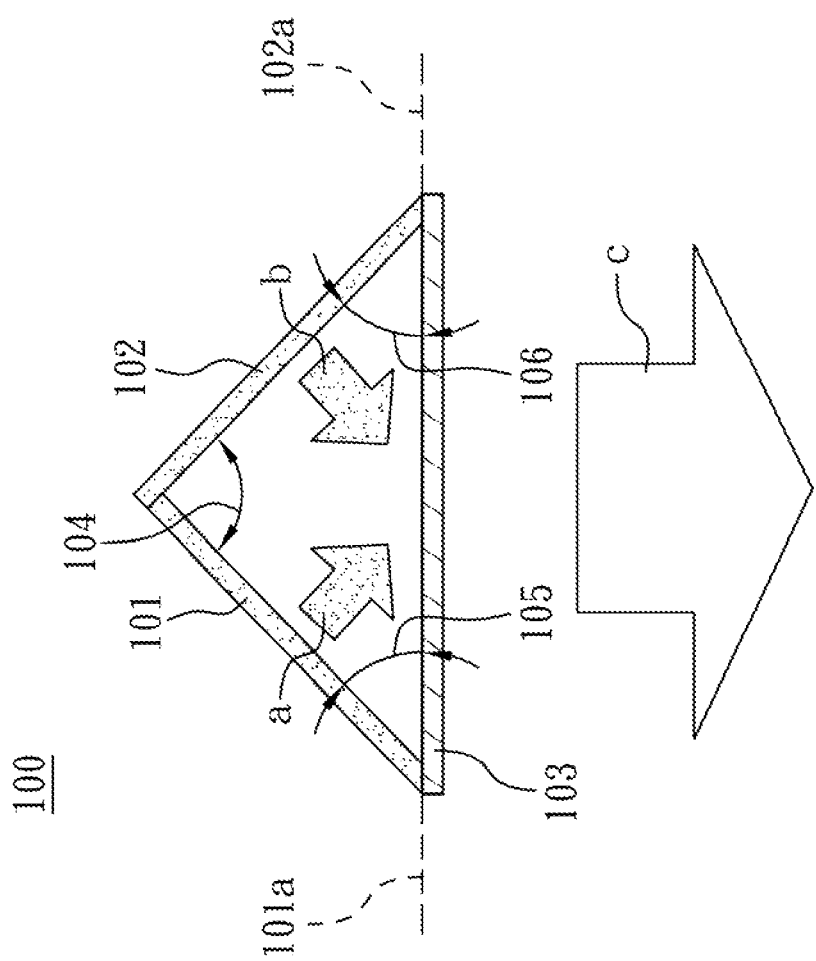
FIG. 1 is a side view of an organic light emitting device according to one embodiment of the present disclosure.

FIG. 1 is a side view of an organic light emitting device 100 according to one embodiment of the present disclosure. The organic light emitting device 100 includes a first organic light emitting diode unit 101, a second organic light emitting diode unit 102, and an optical component 103, wherein two ends of the optical component 103 are connected to the first organic light emitting diode unit 101 and the second organic light emitting diode unit 102 respectively. The first organic light emitting diode unit 101 is connected with the second organic light emitting diode unit 102, and an internal angle 104 is formed between the first organic light emitting diode unit 101 and the second light emitting diode unit 102. A first incline angle 105 is formed between the first organic light emitting diode unit 101 and a virtual base plane 101a which is parallel to the optical component 103, and a second incline angle 106 is formed between the second organic light emitting diode unit 102 and the virtual base plane 102a which is parallel to the optical component 103. A sum of the first incline angle 105, the second incline angle 106, and the internal angle 104 is 180 degrees. According to the embodiment of FIG. 1, the first organic light emitting diode unit 101, the second organic light emitting diode unit 102, and the optical component 103 are connected together to form a triangle structure.

The surfaces of the first organic light emitting diode unit 101 and the second organic light emitting diode unit 102 are planar, so that a first light emitting region a of the first organic light emitting diode unit 101 and a second light emitting region b of the second light emitting diode unit 102 are both planar light source. Due to the triangle structure being formed by the inter-connection of the first organic light emitting diode unit 101, the second organic light emitting diode unit 102, and the optical component 103, the light intensity of the first light emitting region a is strongest at the first incline angle 105 and is weakest at the second incline angle 106, on the contrary, the light intensity of the second light emitting region b is strongest at the second incline angle 106 and is weakest at the first incline angle 105. Therefore, if the first light emitting region a and the second light emitting region b have the same wavelength, a third light emitting region c with a uniform light intensity is formed by mixing the two thereof. If the wavelength of the first organic light emitting region a is different from the wavelength of the second organic light emitting region b, programmable power sources can be applied individually to the first organic light emitting diode unit 101 and the second light emitting diode unit 102 for enhancing the uniformity of light intensity of the third light emitting region c.

Figure 2:
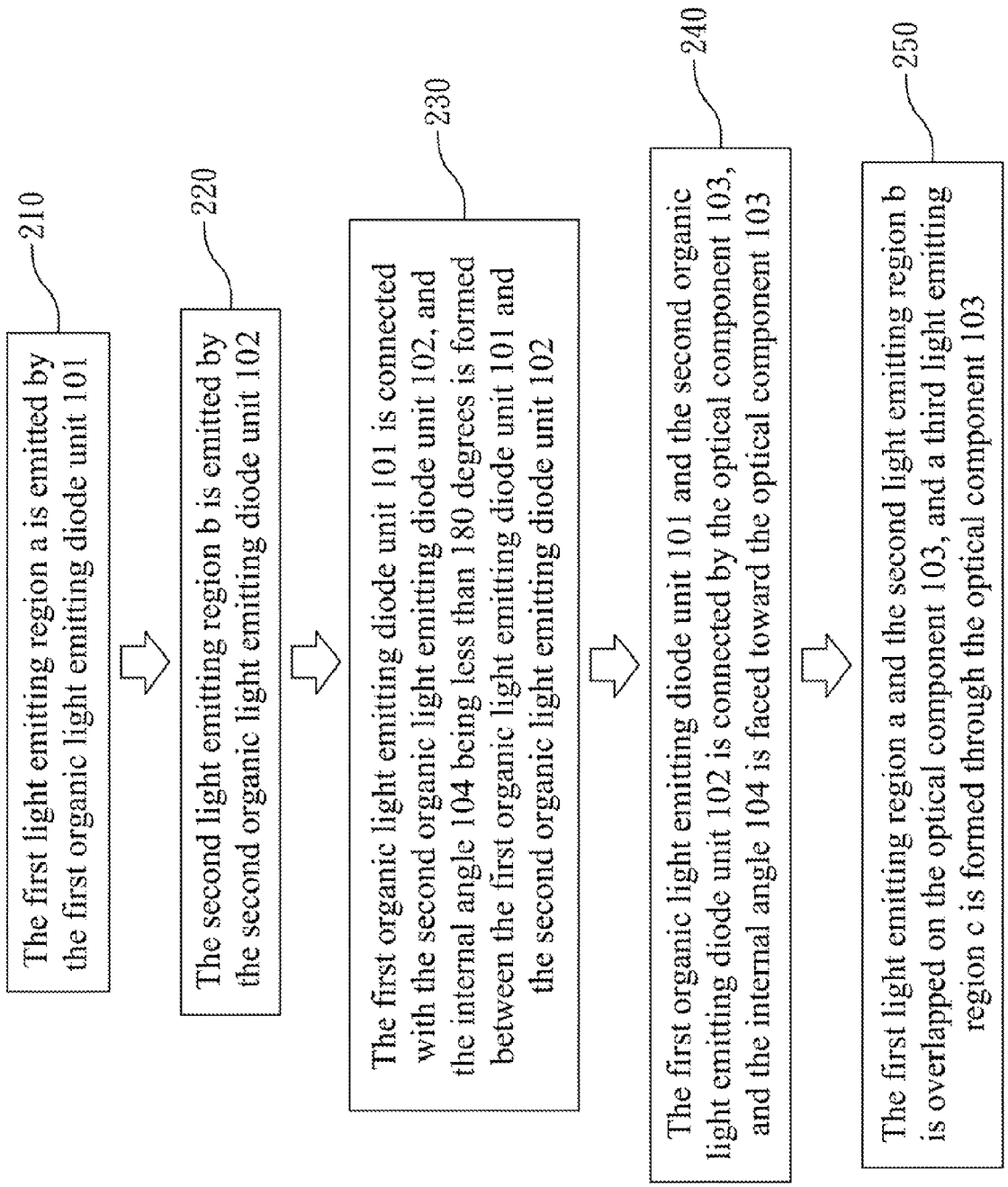
FIG. 2 is a flowchart showing a light adjusting method utilizes the organic light emitting device of FIG. 1 according to another embodiment of the present disclosure.

FIG. 2 is a flowchart showing a light adjusting method utilizing the organic light emitting device 100 of FIG. 1 according to another embodiment of the present disclosure. In FIG. 2, the light adjusting method includes the steps as follows. In step 210, the first light emitting region a is emitted by the first organic light emitting diode unit 101. In step 220, the second light emitting region b is emitted by the second organic light emitting diode unit 102. In step 230, the first organic light emitting diode unit 101 is connected with the second organic light emitting diode unit 102, and the internal angle 104 being less than 180 degrees is formed between the first organic light emitting diode unit 101 and the second organic light emitting diode unit 102. In step 240, the first organic light emitting diode unit 101 and the second organic light emitting diode unit 102 are connected by the optical component 103, and the internal angle 104 is faced toward the optical component 103. In step 250, the first light emitting region a and the second light emitting region b is overlapped on the optical component 103, and a third light emitting region c is formed through the optical component 103.

In details, the first organic light emitting diode unit 101 and the second organic light emitting diode unit 102 can be connected to at least one programmable control circuit individually, thus a high controllability is obtained. The first organic light emitting diode unit 101 and the second organic light emitting diode unit 102 can be individually made of a fluorescence material, a phosphorescence material, or a mixture of the two, and can emit different light color individually, such as red, yellow, green, blue, or white. When the first organic light emitting diode unit 101 and the second organic light emitting diode unit 102 have the same light color, a uniform light intensity of the third light emitting region c is obtained by overlapping the first light emitting region a and the second light emitting region b on the optical component 103. When the first organic light emitting diode unit 101 and the second organic light emitting diode unit 102 have different light colors, a mixed light color of the third light emitting region c is obtained by overlapping the first light emitting region a and the second light emitting region b on the optical component 103.

FIG. 3 is a side view of an organic light emitting device 200 according to another embodiment of the present disclosure. An organic light emitting device 200 includes a first organic light emitting diode unit 201, a second organic light emitting diode unit 202, an optical component 203, a first light guide 205, and a second light guide 206. Similar to the first embodiment, the first organic light emitting diode unit 201, the second organic light emitting diode unit 202, and the optical component 203 are connected together to form a triangle structure, and an internal angle 204 is formed between the first organic light emitting diode unit 201 and the second organic light emitting diode unit 202. In this embodiment, the internal angle 204 is 90 degrees. The first light guide 205 is disposed on one side of the first organic light emitting diode unit 201 and is faced to the optical component 203. The second light guide 206 is disposed on one side of the second organic light emitting diode unit 202 and is faced to the optical component 203. Therefore, the light extracting efficiency can be enhanced through the first light guide 205 and the second light guide 206, and the first light emitting region a and the second light emitting region b can be overlapped on the optical component 203 more uniformly so as to enhance the light intensity of the third light emitting region c. In some implementations, light guides can also be attached on one surface or both surfaces of the optical component 203 for enhancing the light uniformity and the intensity of the third light emitting region c.

Figure 4:
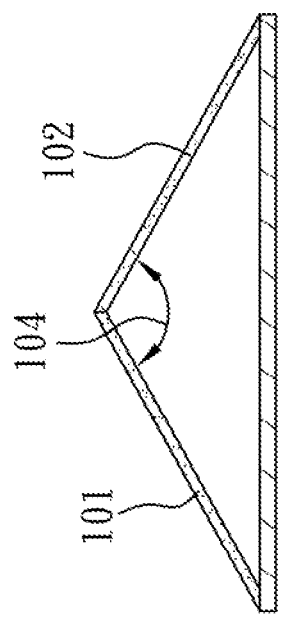
FIG. 4 is a side view of the internal angle of FIG. 1.

FIG. 4 is a side view of the internal angle 104 of the organic light emitting device 100 of FIG. 1. For the purpose of achieving light-overlapping and compact size at the same time, the internal angle 104 can be increased from 90 degrees to 120 degrees. In the situation that the first organic light emitting diode unit 101 and the second organic light emitting diode unit 102 have the same light colors, when the internal angle 104 is 90 degrees, the light emitting area of the third light emitting region c can be 1.42 times larger than the original light emitting region a or light emitting region b, and when the internal angle 104 is 120 degrees, the light emitting area of the third light emitting region c can be 1.73 times larger than the original light emitting region a or light emitting region b.

Figure 5:
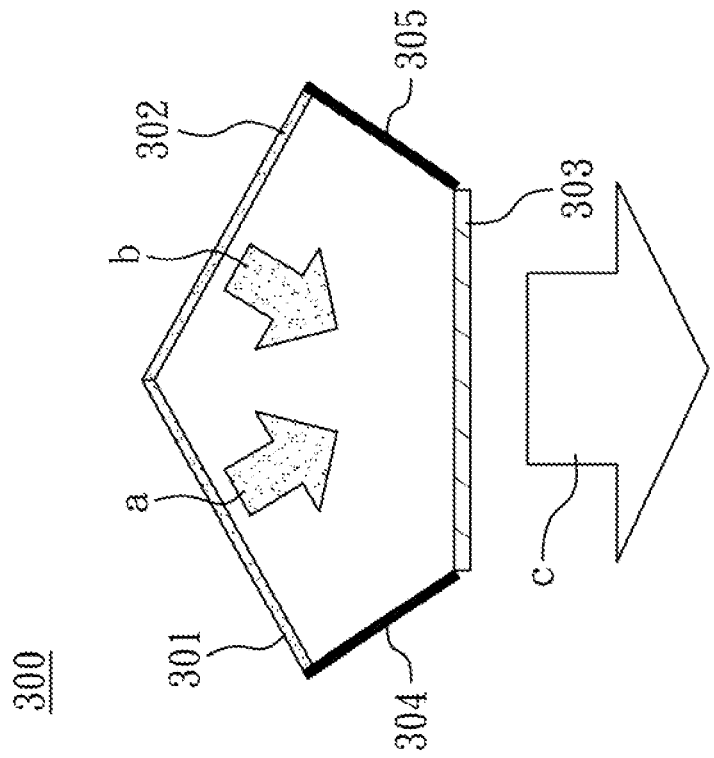
FIG. 5 is a side view of an organic light emitting device according to yet another embodiment of the present disclosure.

FIG. 5 is a side view of an organic light emitting device 300 according to yet another embodiment of the present disclosure. An organic light emitting device 300 includes a first organic light emitting diode unit 301, a second organic light emitting diode unit 302, an optical component 303, a first reflection component 304, and a second reflection component 305. One side of the first organic light emitting diode unit 301 is connected with one side of the second organic light emitting diode unit 302, the other side of the organic light emitting diode unit 301 is connected with one side of the first reflection component 304, and the other side of the second organic light emitting diode unit 302 is connected with one side of the second reflection component 305. Finally, the optical component 303 is inter-connected with the other side of the first reflection component 304 and the other side of the second reflection component 305. Therefore, the first organic light emitting diode unit 301, the second organic light emitting diode unit 302, the optical component 303, the first reflection component 304, and the second reflection component 305 are connected together to form a pentagon structure. Therefore, the lights emitted from the first light emitting region a and the second light emitting region b are reflected by the first reflection component 304 and the second reflection component 305, and thereby collecting more lights on the optical component 303 for producing a uniform light of the third light emitting region c.

Figure 6:
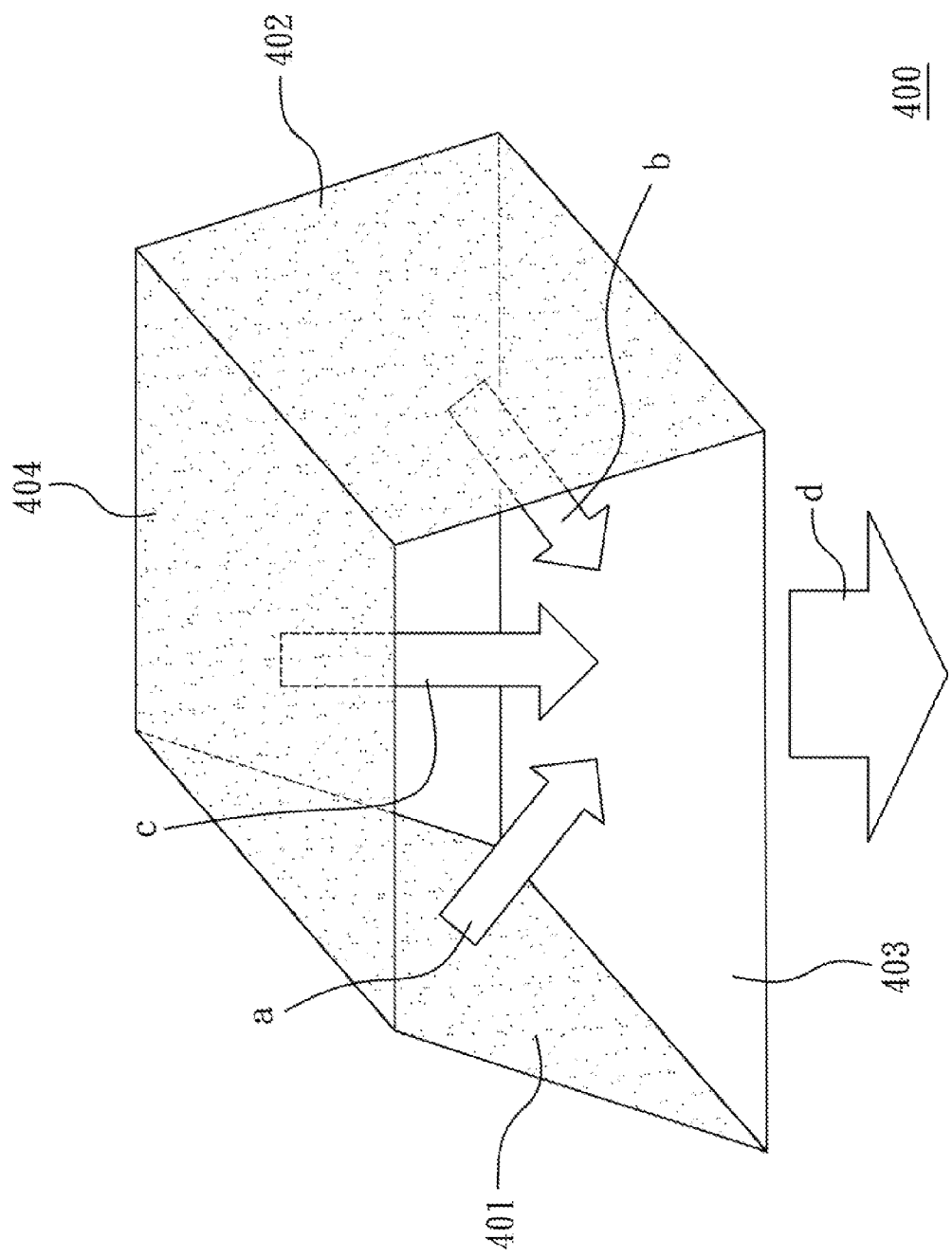
FIG. 6 is a perspective view of an organic light emitting device according to still another embodiment of the present disclosure.

FIG. 6 is a perspective view of an organic light emitting device 400 according to still another embodiment of the present disclosure. An organic light emitting device 400 includes a first organic light emitting diode unit 401, a second organic light emitting diode unit 402, a third organic light emitting diode unit 404, and an optical component 403. The first organic light emitting diode unit 401, the second organic light emitting diode unit 402, the third organic light emitting diode unit 404, and the optical component 403 are connected together to form a tetrahedron structure. A first light emitting region a, a second light emitting region b, and a third light emitting region c are overlapped on the optical component 403, and a fourth light emitting region d is formed. Therefore a more accurate and intensified color mixing can be obtained due to adding the third organic light emitting diode unit 404. There are many applications that can be implemented for the structure of the organic light emitting device 400. The first organic light emitting diode unit 401 and the second organic light emitting diode unit 402 is connected to from a basic structure. Extra optical elements such as organic light emitting diode units or reflection components can be added to the space formed between the basic structure and the optical component 403, and finally, all optical elements are connected together to form a three-dimensional structure. Each organic light emitting diode unit in the three-dimensional structure can have different optical characteristics individually, such as light intensity, wavelength, etc. All the lights generated from the optical elements are overlapped on the optical component 403, and a mixed light is formed through the optical component 403. The wavelength of each organic light emitting diode unit can be adjusted individually, thus a precision choice of various color mixing in the CIE color space is obtained. The manufacturing process of an organic light emitting diode unit with single spectral region, or say color is easier than an organic light emitting diode unit with multiple spectral region, or say color, thus a cost per power can be reduced.

Figure 7:
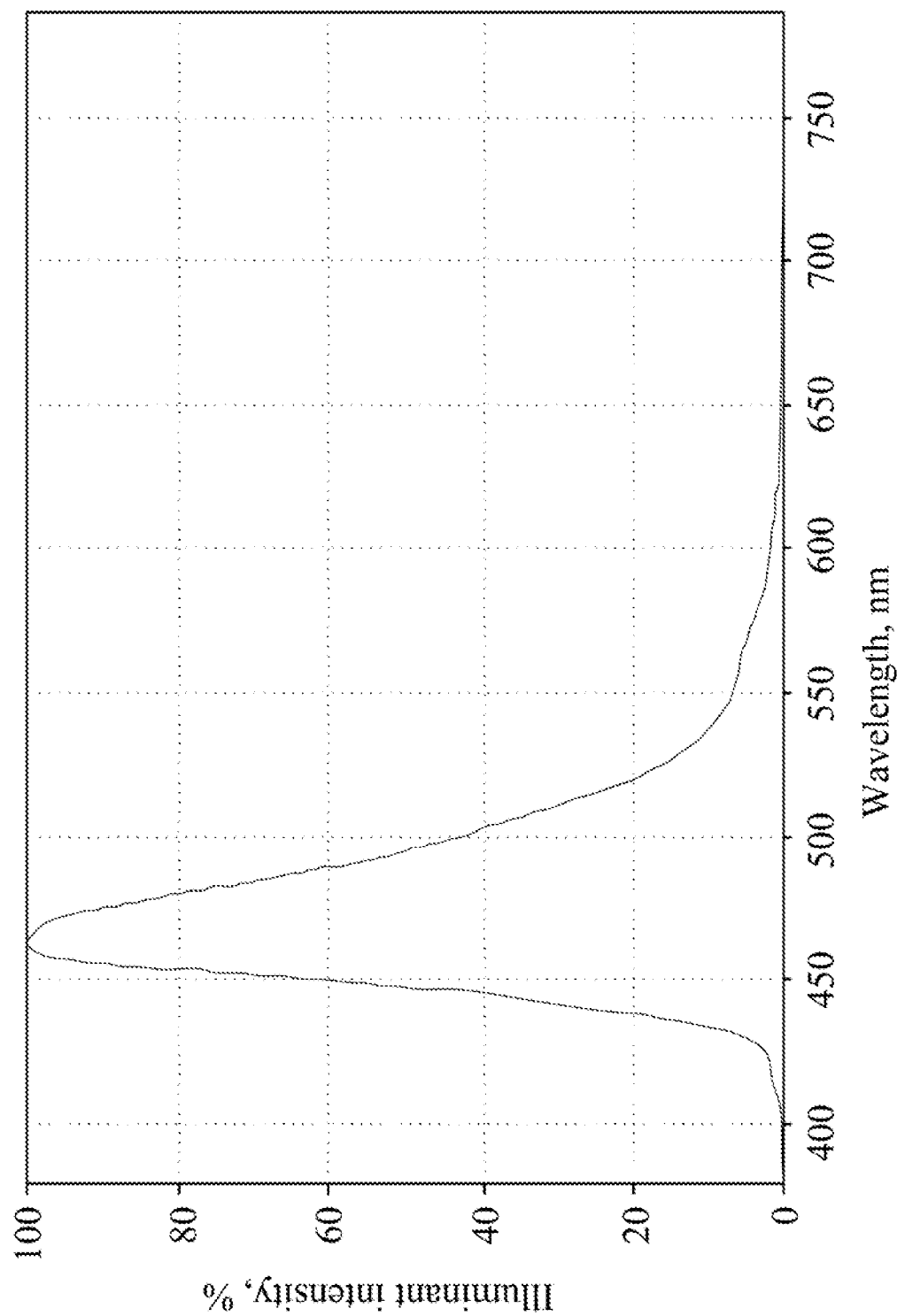
FIG. 7 shows an optical spectrum of the first organic light emitting diode unit of FIG. 1.
Figure 8:
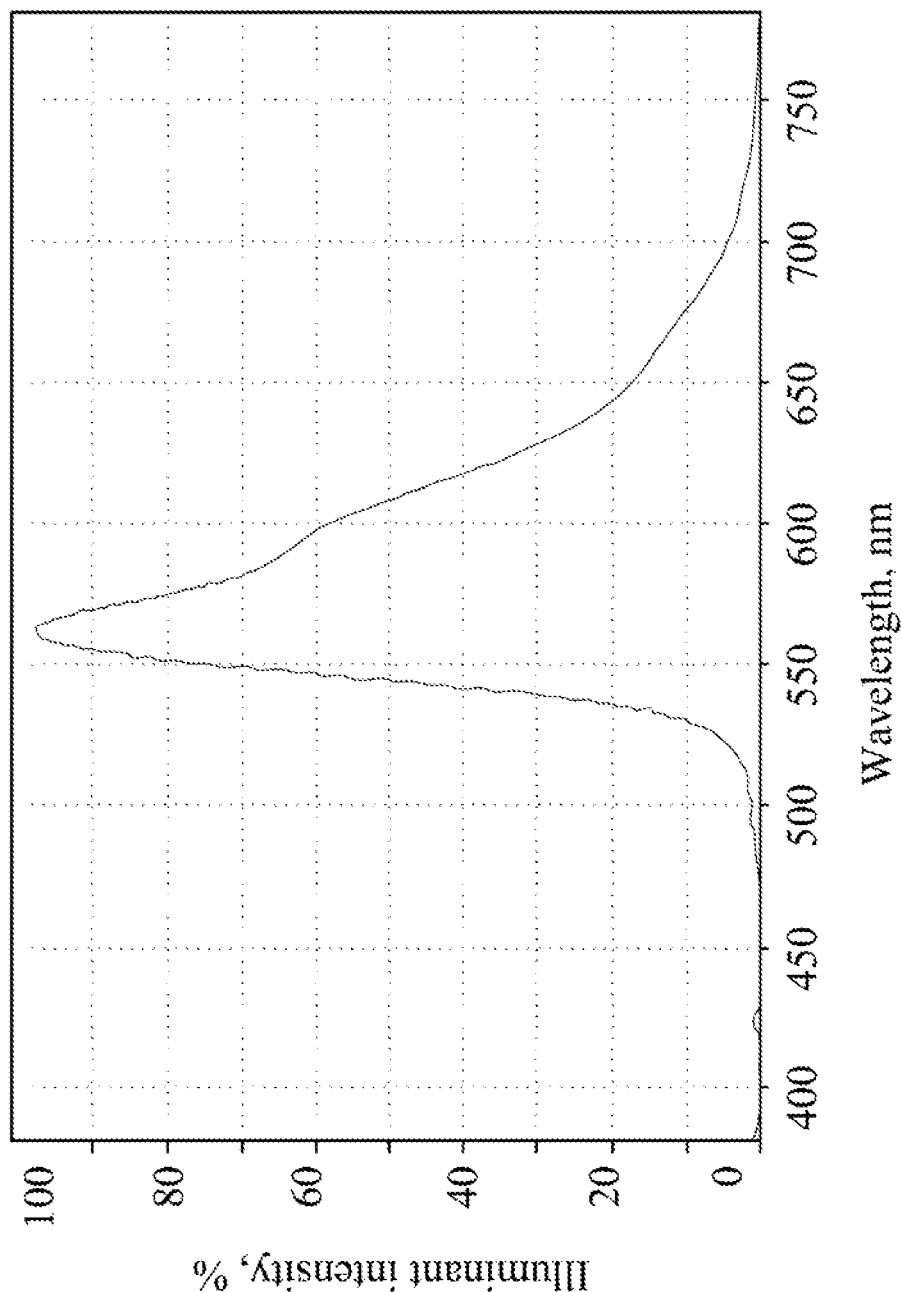
FIG. 8 shows an optical spectrum of the second organic light emitting diode unit of FIG. 1.

FIG. 7 shows an optical spectrum of the first organic light emitting diode unit 101 of FIG. 1, and FIG. 8 shows an optical spectrum of the second organic light emitting diode unit 102 of FIG. 1. In the organic light emitting device 100 of FIG. 1, it is possible for producing a white light color of the third light emitting region c by choosing the same white color of the first organic light emitting diode unit 101 and the second light emitting diode unit 102, or by choosing two complementary colors in the CIE color space. For example, the first organic light emitting diode unit 101 can be made of a fluorescence material for emitting a blue light, and the second organic light emitting diode unit 102 can be made of phosphorescence material for emitting a yellow light, and a mixture of the blue light and the yellow light is a white light. The blue light is corresponded to a color coordinate point of x=0.144, y=0.161 in the CIE color space, and the yellow light is corresponded to a color coordinate point of x=0.484, y=0.502 in the CIE color space, so that a precision white light can be obtained.

Figure 9:
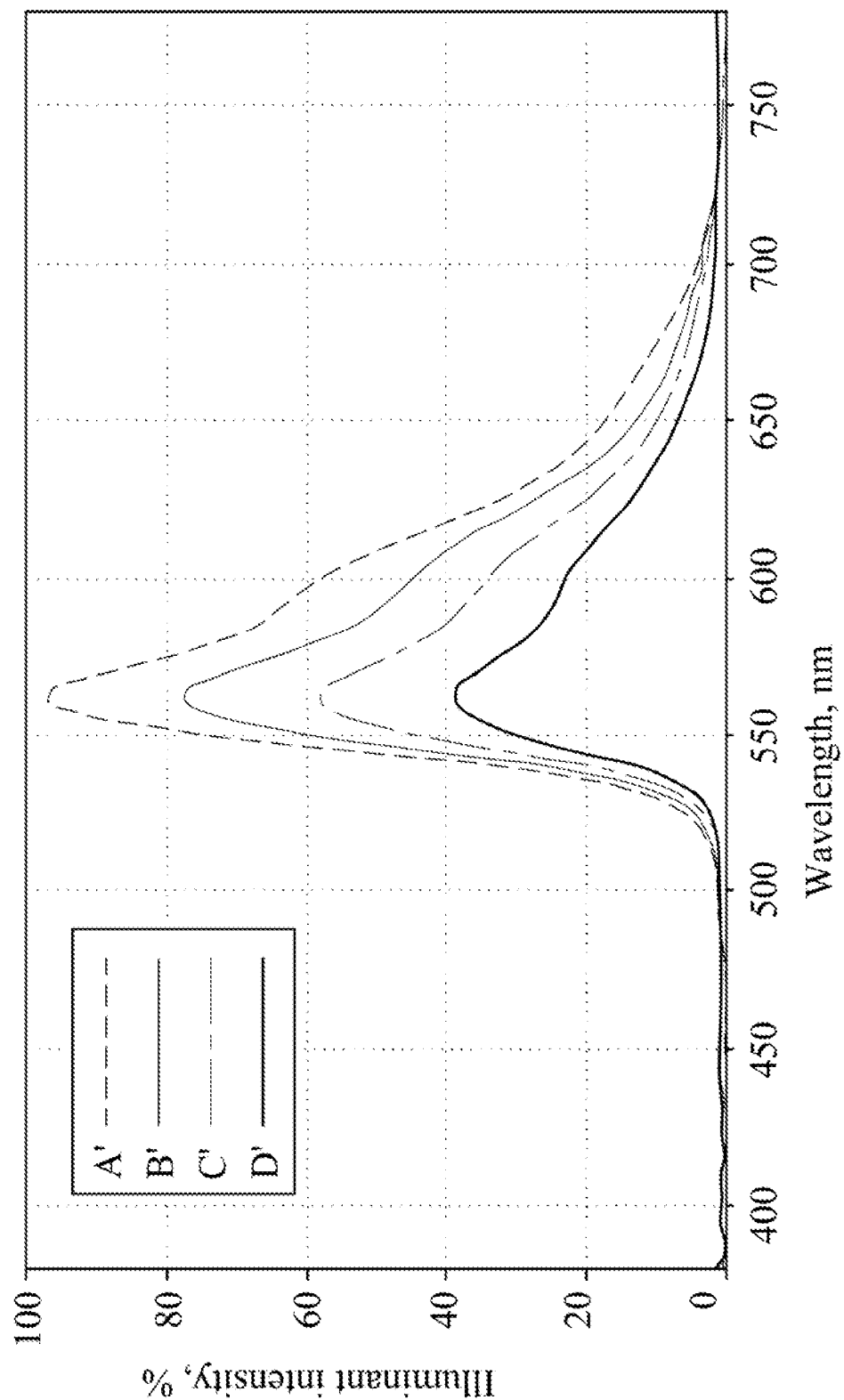
FIG. 9 shows an optical spectrum varied with different powers applied to the second organic light emitting diode unit of FIG. 1.

FIG. 9 shows an optical spectrum varied with different powers applied to the second organic light emitting diode unit 102 of FIG. 1. The first organic light emitting diode unit 101 and the second light emitting diode unit 102 can be controlled individually for performing different performances, such as light intensity, wavelength, etc. In FIG. 8, A', B', C', and D' represents the light intensity varied with different power ratios at 100%, 80%, 60%, and 40%. From FIG. 8, the light intensity decrease with the decreasing of the power ratio, however, the peak of wavelength remains a constant value. Therefore, it is favorable for adjusting the light color, and an excellent controllability is obtained.

Figure 10:
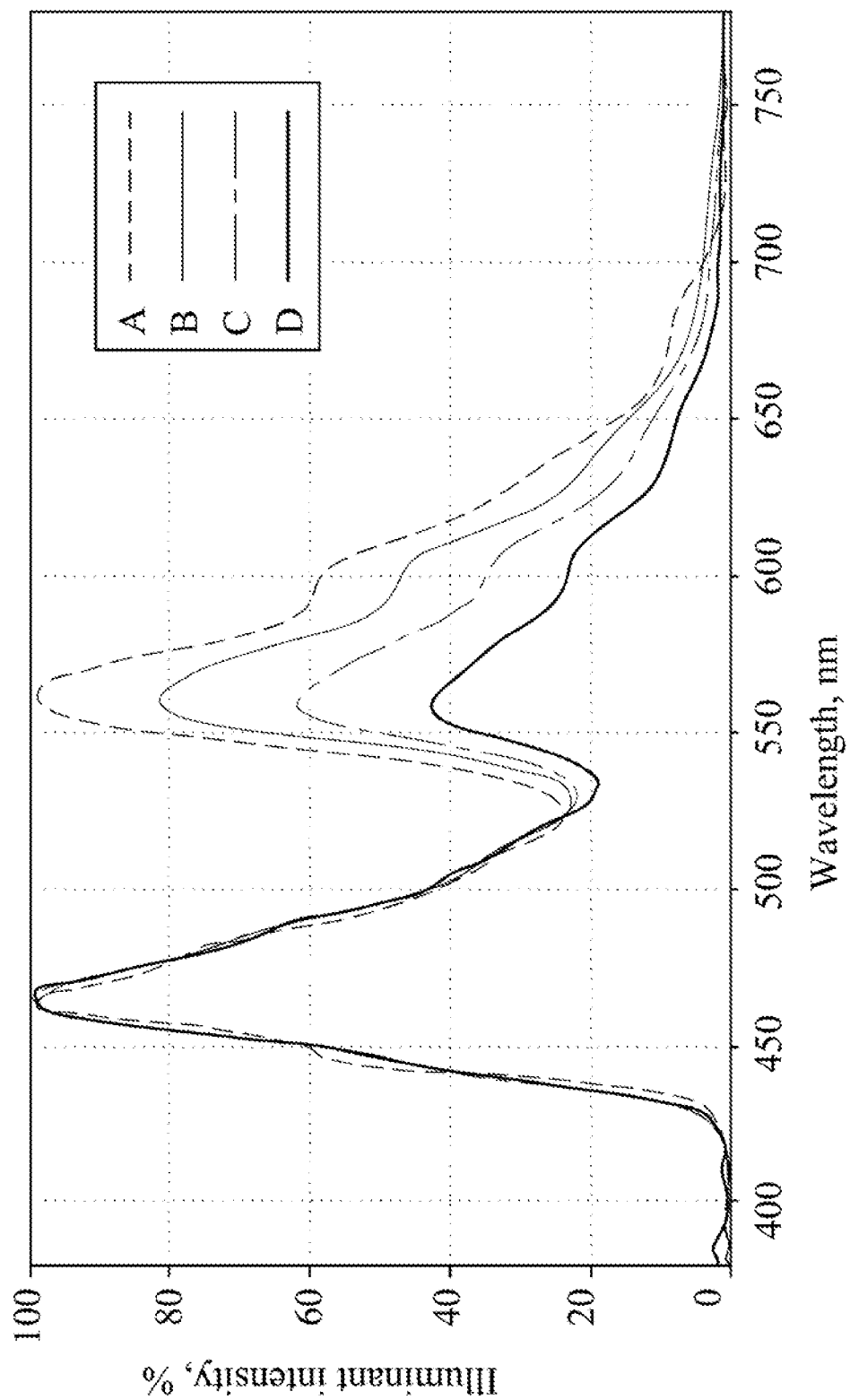
FIG. 10 shows a combined optical spectrum of the first organic light emitting diode unit and the second light emitting diode unit of FIG. 1.

FIG. 10 shows a combined optical spectrum of the first organic light emitting diode unit 101 and the second light emitting diode unit 102 of FIG. 1. In FIG. 10, curves A, B, C, and D represents an overlapped optical spectrum varied with different power ratio applied to the first organic light emitting diode unit 101 and the second organic light emitting diode unit 102. A constant power ratio 100% is applied to the first organic light emitting diode unit 101, and different power ratios at 100%, 80%, 60%, and 40% are applied to the second organic light emitting diode unit 102.

Figure 11:
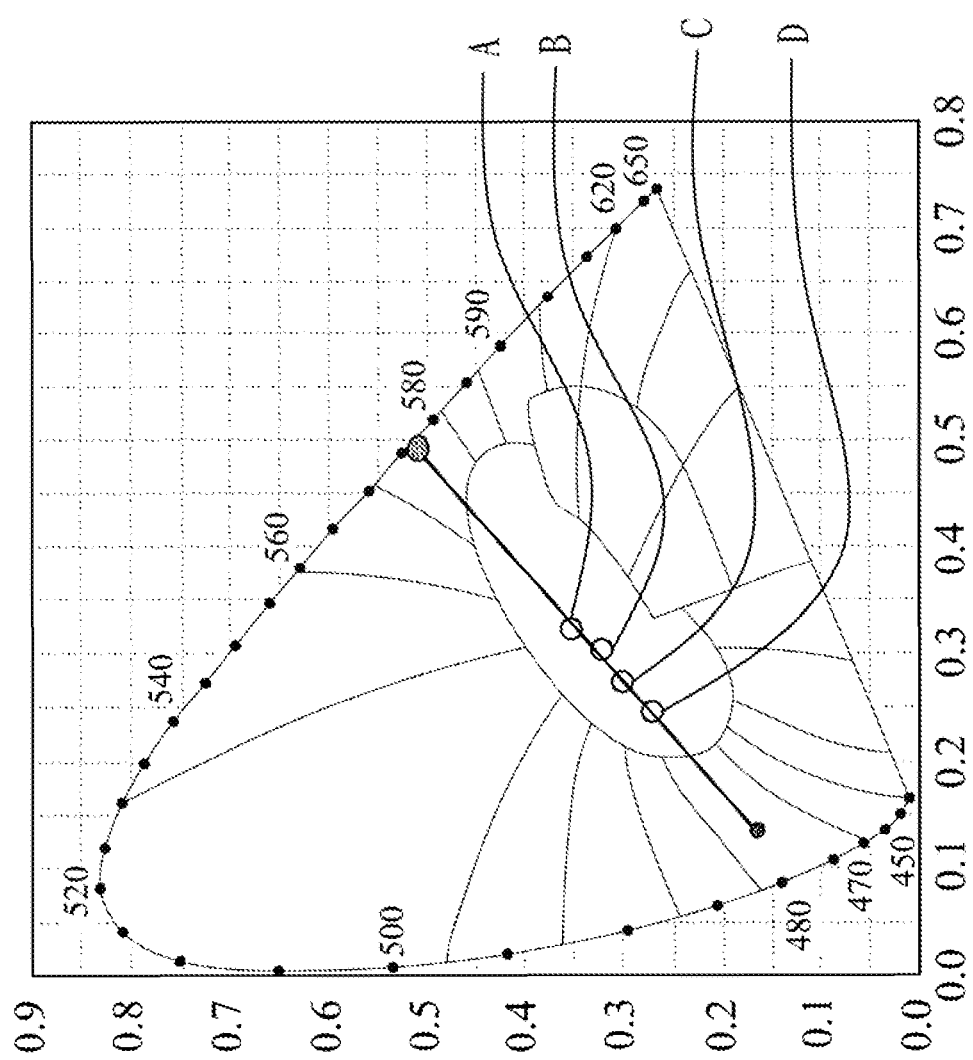
FIG. 11 shows a CIE diagram of a mixing of the first organic light emitting diode unit and the second organic light emitting diode unit of FIG. 10.

FIG. 11 shows a CIE diagram of a mixing of the first organic light emitting diode unit 101 and the second organic light emitting diode unit 102 of FIG. 10. In FIG. 11 the yellow light spectrum of the second organic light emitting diode unit 102 varied with 100%, 80%, 60%, 40% applied powers are shown, in which the color coordinate points in the CIE color space are referred to x=0.487, y=0.507; x=0.484, y=0.503; x=0.484, y=0.501; and x=0.481, y=0.498 respectively. The blue light of the first organic light emitting diode unit 101 is corresponded to a color coordinate point of x=0.144, y=0.161 in the CIE color space with a constant 100% power ratio. By a theory calculation, A, B, C, and D represent the four different conditions respectively. The color coordinate point of condition B is much closer to the color coordinate point of a standard white light in the CIE color space, which means that an excellent controllability can be achieved.

Figure 12:
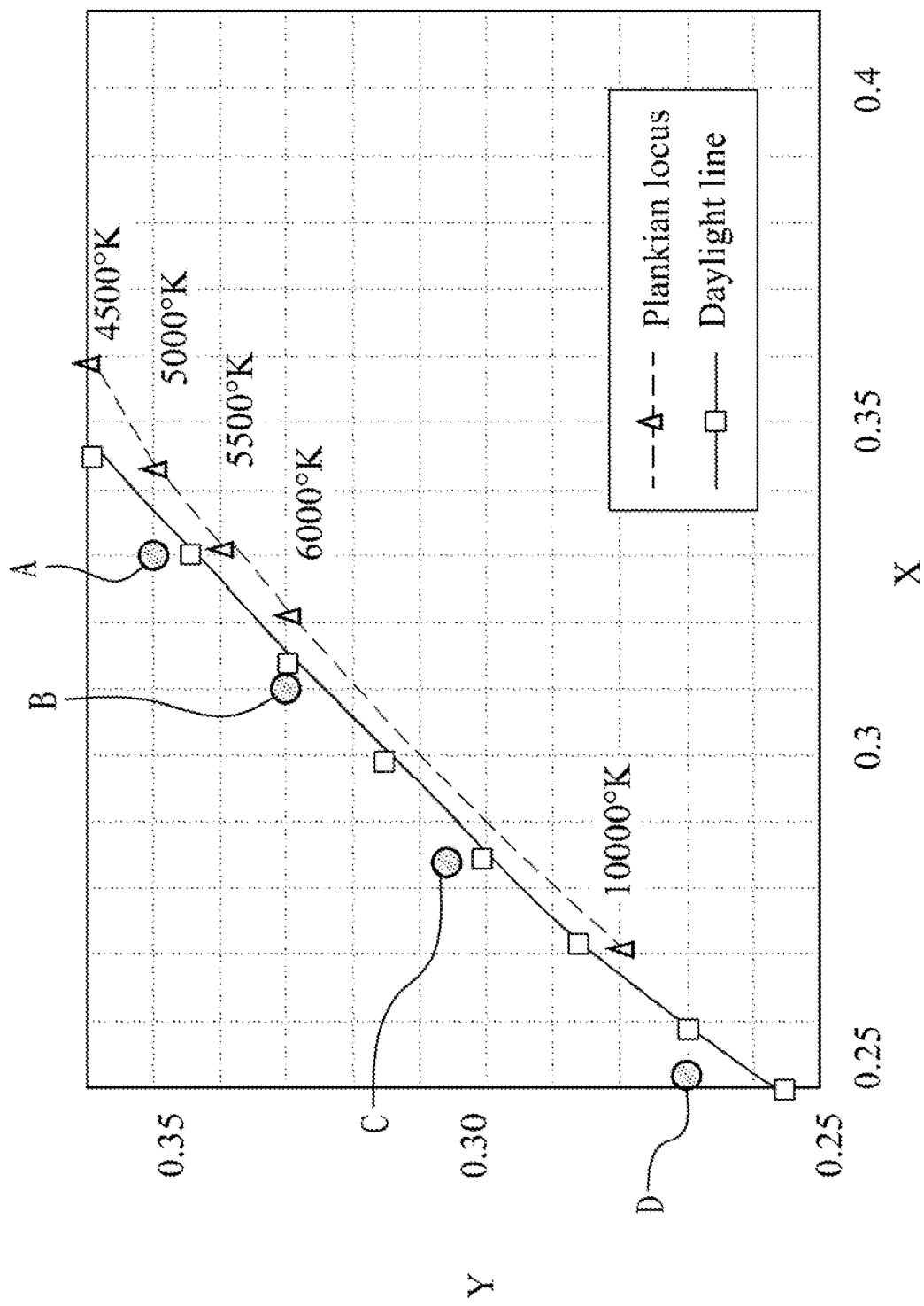
FIG. 12 shows a color temperature curve of a mixing of the first organic light emitting diode unit and the second organic light emitting diode unit of FIG. 10.

FIG. 12 shows a color temperature curve of a mixing of the first organic light emitting diode unit and the second organic light emitting diode unit of FIG. 10. A color temperature curve by fitting the conditions A, B, C, and D is close to a Plankian Locus curve by theory calculation, which means that the white light of the organic light emitting devices of the disclosure is preferable in color rendering index matching with those white illuminants of the black body radiation standard, and fits even better with those of a day-light standard illuminant line.

An organic light emitting device and light adjusting method thereof is provided. The organic light emitting device includes, according to one embodiment of the present disclosure, a first organic light emitting diode unit, a second organic light emitting diode, and an optical component. The first light emitting diode unit is connected with the second light emitting diode unit, and an internal angle is formed between the first organic light emitting diode unit and the second light emitting diode unit. The first organic light emitting diode unit emits a first light emitting region and the second organic light emitting diode unit emits a second light emitting region. The first light emitting region and the second light emitting region are overlapped on the optical component, and a third light emitting region is formed. When the first light emitting region and the second light emitting region have the same wavelengths, an enhanced light intensity of the third light emitting region is obtained by the pre-designed internal angle. When the first light emitting region and the second light emitting region have different wavelengths, a precision mixing of the light color in the CIE color space can be obtained by individual adjustment of the driving power/current of the first organic light emitting diode unit and the second organic light emitting diode unit.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An organic light emitting device, comprising:
    a first organic light emitting diode unit, wherein a first incline angle is formed between the first organic light emitting diode unit and a virtual base plane;
    second organic light emitting diode unit connected with the first organic light emitting diode unit, wherein a second incline angle is formed between the second organic light emitting diode unit and the virtual base plane, and an internal angle is formed between the first organic light emitting diode unit and the second organic light emitting diode unit; and
    an optical component connecting the first organic light emitting diode unit and the second light emitting diode unit, wherein the internal angle is faced toward the optical component;
    wherein a first light emitting region of the first organic light emitting diode unit and a second light emitting region of the second organic light emitting diode unit are overlapped on the optical component, and a sum of the first incline angle, the second incline angle, and the internal angle is 180 degrees;
    wherein the organic light emitting device comprises a first reflection component and a second reflection component, the first reflection component is disposed between the first organic light emitting diode unit and the optical component, and the second reflection component is disposed between the second organic light emitting diode unit and the optical component.

2. The organic light emitting device of claim 1, wherein a surface of the first organic light emitting diode unit is planar.

3. The organic light emitting device of claim 1, further comprising:
    a first light guide disposed on one side of the first organic light emitting diode unit.

4. The organic light emitting device of claim 1, wherein a surface of the second organic light emitting diode unit is planar.

5. The organic light emitting device of claim 3, further comprising:
    a second light guide disposed on one side of the second organic light emitting diode unit.

6. The organic light emitting device of claim 1, wherein the first organic light emitting diode unit is made of at least one fluorescence material and at least one phosphorescence material.

7. The organic light emitting device of claim 1, wherein the second organic light emitting diode unit is made of at least one fluorescence material and at least one phosphorescence material.

8. The organic light emitting device of claim 1, wherein the first organic light emitting diode unit is made of a mixture of at least one fluorescence material and at least one phosphorescence material.

9. The organic light emitting device of claim 1, wherein the second organic light emitting diode unit is made of a mixture of at least one fluorescence material and at least one phosphorescence material.

10. The organic light emitting device of claim 1, wherein a light color of the first organic light emitting diode unit is red, yellow, green, blue, or white.

11. The organic light emitting device of claim 1, wherein a light color of the second organic light emitting diode unit is red, yellow, green, blue, or white.

12. The organic light emitting device of claim 1, wherein the internal angle ranges between 90 degrees and 120 degrees.

13. The organic light emitting device of claim 1, wherein the optical component retains the highest transparency at specified spectral regions.

14. The organic light emitting device of claim 13, wherein the optical component is made of glass or plastic material.

15. The organic light emitting device of claim 1, wherein a surface of the optical component is planar or curved.

16. The organic light emitting device of claim 1, wherein a first emitting light emitted from the first organic light emitting diode unit and a second emitting light emitted from the second organic light emitting diode unit are reflected by the first reflection component.

17. The organic light emitting device of claim 1, wherein a first emitting light emitted from the first organic light emitting diode unit and a second emitting light emitted from the second organic light emitting diode unit are reflected by the second reflection component.

18. A light adjusting method utilizing the organic light emitting device of claim 1, comprising:
    emitting the first light emitting region by the first organic light emitting diode unit;
    emitting the second light emitting region by the second organic light emitting diode unit;
    connecting the first organic light emitting diode unit and the second organic light emitting diode unit, and forming the internal angle being less than 180 degrees between the first organic light emitting diode unit and the second organic light emitting diode unit;

connecting the first organic light emitting diode unit and the second organic light emitting diode unit by the optical component, and facing the internal angle toward the optical component;

disposing the first reflection component between the first organic light emitting diode unit and the optical component;

disposing the second reflection component between the second organic light emitting diode unit and the optical component;

reflecting the first light emitting region or the second light emitting region by the first reflection component;

reflecting the first light emitting region or the second light emitting region by the second reflection component; and overlapping the first light emitting region and the second light emitting region on the optical component, and forming a third light emitting region through the optical component.

19. The light adjusting method of claim 18, wherein a light color of the first light emitting region is red, yellow, green, blue, or white.

20. The light adjusting method of claim 18, wherein a light color of the first light emitting region is red, yellow, green, blue, or white.

21. The light adjusting method of claim 18, wherein a light color of the third light emitting region is red, yellow, green, blue, white, or a combination of two thereof.

22. The light adjusting method of claim 18, wherein the internal angle ranges between 90 degrees and 120 degrees.

23. The light adjusting method of claim 18, wherein the first organic light emitting diode unit and the second organic light emitting diode unit are connected with at least one programmable control circuit respectively, thereby adjusting the first light emitting region and the second light emitting region respectively.

* * * * *